United States Patent
LeClerc

[11] Patent Number: 5,834,965
[45] Date of Patent: Nov. 10, 1998

[54] CIRCUIT FOR SWITCHING CURRENT IN A MAINLY INDUCTIVE LOAD

[75] Inventor: Patrick LeClerc, Caen, France

[73] Assignee: U.S. Philips Corporation, New York, N.Y.

[21] Appl. No.: 764,699

[22] Filed: Dec. 4, 1996

[30] Foreign Application Priority Data

Dec. 6, 1995 [FR] France ................................ 95 14421

[51] Int. Cl.⁶ ........................... H03K 17/687; G11B 5/09
[52] U.S. Cl. ......................... 327/423; 327/424; 363/58; 363/98
[58] Field of Search ........................... 327/423, 424, 327/448, 494; 363/56, 58, 98

[56] References Cited

U.S. PATENT DOCUMENTS

| | | | |
|---|---|---|---|
| 4,511,809 | 4/1985 | Allen | 327/384 |
| 4,551,772 | 11/1985 | Sliger | 360/46 |
| 5,041,773 | 8/1991 | Takahashi | 318/696 |
| 5,309,347 | 5/1994 | Poma et al. | 363/63 |
| 5,644,484 | 7/1997 | Elango | 363/98 |

OTHER PUBLICATIONS

"150 Mb/s Write Amplifier for Hard Disk Drives with Near Rail–to–Rail Votlage Swing" by H. Veenstra et al, in Proceedings ESSCIRC '95, Lille (FR), 19–21 Sep. 1995, pp. 434–437.

Primary Examiner—Timothy P. Callahan
Assistant Examiner—T. T. Lam
Attorney, Agent, or Firm—Steven S. Rubin

[57] ABSTRACT

An "H" type amplifier circuit uses at least two current mirrors for alternately feeding current into the load in one direction and the other direction. In order to accelerate the turn-on of the current mirrors, a capacitance is associated with each of the two current mirrors. Each capacitance is alternately coupled in parallel with the input of its associated current mirror when this current mirror delivers current, and is coupled to the supply voltage terminals when this current mirror delivers no current. The operation is effected by means of a set of switches.

18 Claims, 2 Drawing Sheets

CIRCUIT FOR SWITCHING CURRENT IN A MAINLY INDUCTIVE LOAD

BACKGROUND OF THE INVENTION

1. Field of the Invention

The invention relates to a circuit for switching a current in a load, comprising at least two current mirrors each having an input and an output, which current mirrors are arranged to drive the load between two terminals of a power supply alternately in one direction or in the other direction via the output of one or the other of the current mirrors, which are actuated alternately by means of a control current fed into the respective input.

2. Description of the Related Art

A circuit of this type, intended for driving a write head for a hard disk, is described in an article entitled "150 Mb/s Write Amplifier for Hard Disk Drives with Near Rail-to-Rail Voltage Swing" by H. Veenstra et al, published in the "Proceedings ESSCIRC '95", Lille (FR), 19–21 Sep. 1995, pp. 434–437.

In the known circuit four current mirrors are arranged in an "H" configuration to power the load formed by the write head, and two current mirrors are alternately powered in accordance with one diagonal and subsequently in accordance with the other diagonal of the configuration by current sources which are switched to supply a current of either nominal value or zero value.

The known circuit is implemented with bipolar transistors and, in order to obtain a satisfactory switching speed, the PNP transistors of the two current mirrors coupled to positive supply voltage should be transistors with a vertical structure. However, the technological process for obtaining such transistors is complex and costly, particularly when designed to allow the simultaneous formation of MOS field effect transistors, which are advantageous for the implementation of the control logic.

Besides, the switching circuit known from said document uses a neutralizing technique in order to achieve the desired speed performance. However, this technique is critical and may give rise to instability of the circuit.

SUMMARY OF THE INVENTION

It is an object of the invention to provide a switching circuit which has a performance comparable to that of the known circuit but which can be realized by means of a more conventional and cheaper process.

It is another object of the invention to provide a circuit which does not use the neutralizing technique and which yields a comparable result by other means which do not disturb the operational stability.

Indeed, according to the present invention, a current switching circuit of the type defined in the opening paragraph is characterized in that each of the current mirrors has associated with it, a capacitance and a set of switching devices, which are connected and actuated so as to couple the capacitance either in parallel with the input of its associated current mirror when this current mirror, receiving the control current, delivers current, or with the power supply terminals when this current mirror does not deliver current.

When no capacitances are associated with the current mirrors, the parasitic input capacitances of the current mirrors are charged by the control current, which gives rise to a delay in the response of the mirrors. In accordance with the invention, charging of the parasitic input capacitances of the current mirrors can be effected very rapidly by applying the electric charges stored in the capacitances. Since these electric charges can be stored at a voltage substantially higher than the input voltage of the current mirrors, for example a voltage equal to the supply voltage, the relevant capacitances can be of comparatively small value and are therefore easy to integrate in the circuit.

The invention is all the more advantageous when the control current of the current mirrors is smaller. Thus, without any loss in switching speed, transistors of smaller dimensions can be used in order to implement the control current source in a preferred embodiment of the invention in which the current mirrors have an output current to input current ratio greater than unity.

A saving in semiconductor area can also be achieved in a switching circuit which is further characterized in that the control current which is injected alternately into one or the other of the current mirrors issues from the same current source, whose current is switched to the one or the other of the inputs of the current mirrors by switching devices.

In addition to a speed-up of the current mirrors in the transitional phase from zero output to a nominal output, these current mirrors can also be accelerated in the inverse transitional phase, in a configuration which is characterized in that an additional switching device is connected in parallel with the input of each of the current mirrors, which additional switching device is controlled so as to shunt this input when the current mirror delivers no current.

The invention as defined so far can be used indiscriminately in a circuit with bipolar transistors or with field effect transistors and independently of whether the number of current mirrors is four or only two, two switching devices then effecting the necessary switching operations, at one side of the supply voltage, for example at the side of the positive terminal.

However, the switching circuit in accordance with the invention has special advantages as regards its cost price if the circuit comprises MOS field effect transistors both to form the afore-mentioned switching devices and to form the current mirrors.

Finally, the invention also relates to an apparatus for the storage of digital information by means of a write head of the inductive type, such as a "hard disk" used in the field of information processing, which apparatus is characterized in that it comprises a current switching circuit as defined hereinbefore, for driving the write head.

BRIEF DESCRIPTION OF THE DRAWINGS

The following description with reference to the accompanying drawings, given by way of non-limitative examples, will make it possible to understand the principle of the invention and how it can be realized.

DETAILED DESCRIPTION OF THE PREFERRED EMBODIMENTS

Figure 1:
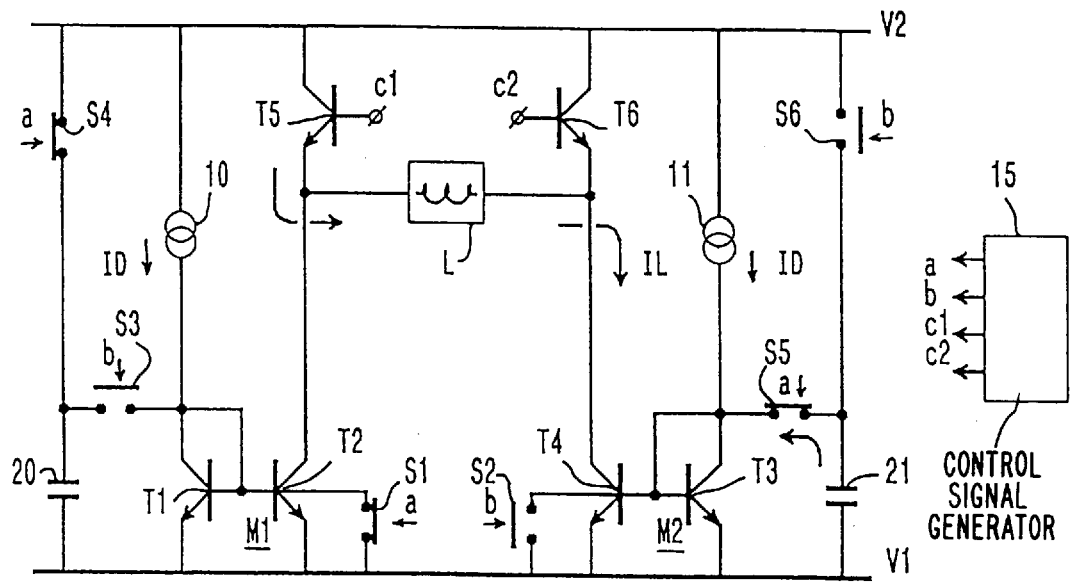
FIG. 1 is a circuit diagram of a first example of a switching circuit in accordance with the invention.

The diagram in FIG. 1 shows a circuit for switching a current IL in a load L of the inductive type, such as for example a write head for a magnetic disk. It comprises two current mirrors M1, M2 comprising transistors T1, T2, T3 and T4, respectively. These transistors have their emitters coupled to a terminal carrying a supply voltage V1 which serves as the reference voltage. The other supply voltage terminal carries a positive voltage V2. The diode-connected transistor T1 forms the input of the current mirror M1, which is driven by a current source 10 which supplies a current ID to this input. In a symmetrical manner, the diode-connected transistor T3 forms the input of the current mirror M2, which is driven by a current source 11 which supplies a current ID of the same value as the current supplied by the source 10. The transistor T2 has its collector, which forms the output of the current mirror M1, connected to one end of the load L and to the emitter of a transistor T5, which has its collector coupled to the supply terminal V2. In a symmetrical manner, the transistor T4 has its collector, which forms the output of the current mirror M2, connected to the other end of the load L and to the emitter of a transistor T6, which has its collector coupled to the supply terminal V2. The current mirrors M1, M2 and the transistors T5 and T6 form an amplifier in a H configuration, by means of which the current IL can be fed into the load L alternately in one direction and in the other direction.

For this purpose, a control signal generator 15 supplies signals a, b, c1 and c2, of which the signal b is the logic complement of the signal a and the signal c2 is the logic complement of the signal c1. In addition, the signals a and c1 are in phase. The signal c1 is applied to the base of the transistor T5, to turn on or turn off this transistor, which functions as a switch. The signal c2 is applied to the base of the transistor T6 and has the same function, but inverted, as the signal c1 in relation to the transistor T5. The signal a and its logic complement b are applied to a series of switches, including a switch S1 disposed so as to shunt the bases of the transistors T1 and T2 to the reference voltage V1 and a switch S2 disposed symmetrically so as to shunt the bases of the transistors T3 and T4 to the same voltage V1. The control signal a is applied to the switch S1 and the control signal b is applied to the switch S2. Thus, the current mirrors M1 and M2 alternately supply a current IL, which is preferably a multiple of the control currents ID, the current mirrors having an output current to input current ratio greater than 1.

Since the current IL necessary for the power supply of the load L can be quite large, of the order of 40 mA, it is advantageous that the current ID is substantially smaller in order to minimize the area occupied by the transistors T1, T3 and by the transistors forming the current sources 10 and 11.

In accordance with the invention, to speed up conduction of the current mirrors M1 and M2, a capacitance 20 associated with the current mirror M1 and a capacitance 21 associated with the current mirror M2 have been provided.

The capacitance 20 can be coupled to the input of the current mirror M1 by means of a switch S3 under control of the control signal b, or it can be coupled via a switch S4, to the supply voltage V2 enabling this capacitance 20 to be charged.

In a symmetrical manner, the capacitance 21 can be coupled to the input of the current mirror M2 by means of a switch S5 under control of the control signal a, or it can be charged to the supply voltage V2 via a switch S6 under control of the control signal b. In this way, the delay caused by charging of the parasitic input capacitances of the current mirrors M1 and M2 can be compensated for by the charge supplied by the capacitances 20 and 21.

Figure 2:
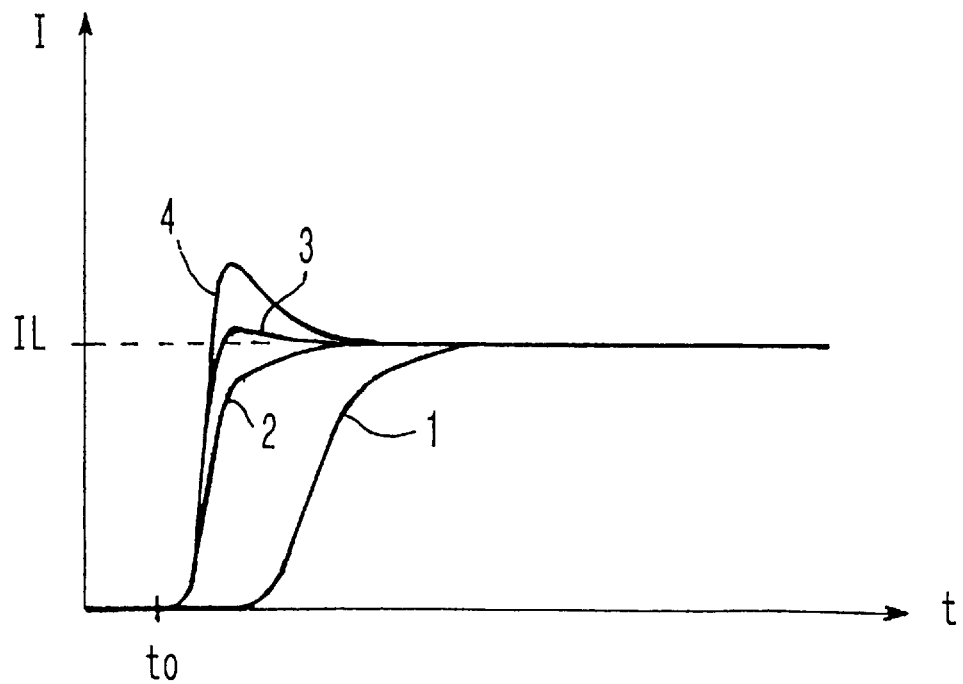
FIG. 2 is a graph representing the turn-on of a current mirror of the circuit in FIG. 1 as a function of time.

FIG. 2 shows curves representing the build-up of the current IL produced at the output of one of the current mirrors M1 or M2 as a function of the time t.

The curve 1 shows a delay in the build-up of the current I relative to the instant to at which switching is started, in the case that the capacitances are not present, which current stabilizes at the value IL.

The curves 2, 3 and 4 represent the rising current transients for increasing capacitances 20 and 21, the curve 3 having a small initial overshoot as compared with the curve 2, the initial overshoot of the curve 4 being larger. This behavior of the current mirrors M1 and M2 can be explained by the fact that the capacitances 20 and 21 are charged to a voltage V2 which is substantially higher than the junction voltage of the transistors, approximately 0.7 V, which is voltage is necessary to turn on these transistors. Moreover, it is evident that the optimum value of the capacitances 20 and 21 is substantially smaller than that of the parasitic input capacitances of the current mirrors, so that this optimum value is generally very small and integration in an integrated circuit is therefore very easy.

For the implementation of the circuit described with reference to FIG. 1, it is usually advantageous that the control signal generator 15 is formed by means of MOS field effect transistors, which are small and allow a highly flexible implementation. When such transistors are fabricated in the same process as the bipolar transistors forming the medium-power amplifier circuit, it is advantageous to construct the switches S1 to S6 also by means of MOS field effect transistors.

Figure 3:
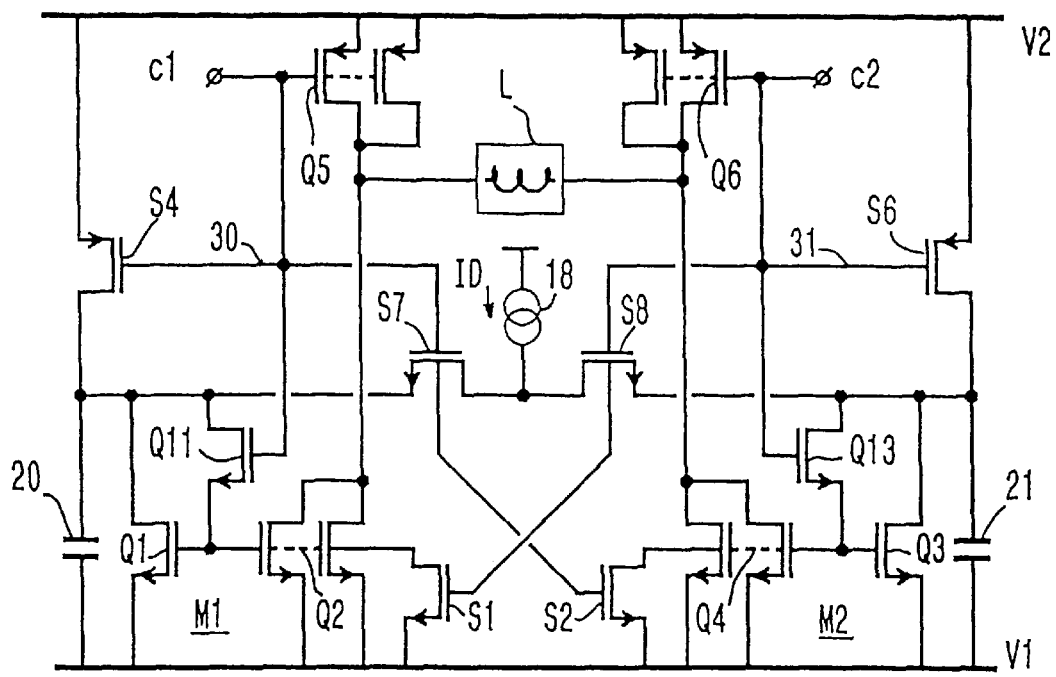
FIG. 3 is a circuit diagram of a second example of the switching circuit in accordance with a preferred embodiment of the invention.

The circuit in FIG. 3 shows another example of an embodiment of the invention in a variant using only MOS transistors of a complementary type.

A current mirror M1 comprises n-channel MOS transistors, the input branch of this current mirror being formed by a transistor Q1 and the output branch by a transistor Q2, the current multiplication factor being symbolized in the Figure by a plurality of elementary transistors connected in parallel. In a symmetrical manner the current mirror M2 comprises an input transistor Q3 and an output transistor Q4 having the same current multiplication factor. The transistor Q2 has its drain connected to one terminal of the load L and to the drain of a p-channel MOS transistor Q5. The transistor Q5 is a transistor of a size suitable to feed the desired current into the load L and can also be formed by a plurality of transistors connected in parallel. In a symmetrical manner, the output transistor Q4 in the current mirror M2 has its drain connected to one terminal of the load L and to the drain of a p-channel MOS transistor Q6, similar to the transistor Q5.

A control signal c1, similar to the signal described with reference to FIG. 1, is applied to the gate of the transistor Q5 and the control signal c2, which is the logic complement of the signal c1, is applied to the gate of the transistor Q6.

The control signal c1 is also applied to the gate of a p-channel transistor S4, which performs the function of and is arranged in the same way as the switch bearing the same reference in FIG. 1, for charging the capacitance 20 associated with the current mirror M1.

The current mirrors M1 and M2 receive an input current ID from a current source 18 which, contrarily to that in the circuit of FIG. 1, is here a single current source. The current ID is alternately applied to the input of the current mirror M1 and to the input of the current mirror M2 by means of the group of two switching transistors S7 and S8, which are n-channel transistors. The transistor S7 receives the control signal c1 and the transistor S8 receives the control signal c2. Under the influence of the control signal c1, the current ID can thus be applied to the drain of the transistor Q1, via a line 30 coupling the drain of the transistor S4 and the capacitance 20, and to the source of the transistor S7. The drain of the transistor Q1 is coupled to the gates of the transistors Q1 and Q2 by means of an n-channel MOS switching transistor Q11 whose gate receives the same control signal c1. As a result of this, the transistors S7 and Q11 conduct simultaneously.

In a symmetrical manner a similar arrangement is realized with the current mirror M2 and transistors operating as switches S6, S8 Q13, which all receive the control signal c2 at their gates. When the current ID from the source 18 is supplied via the line 31, which is symmetrical with the line 30, the transistor S6 is turned off, the transistor S8 is turned on as is the transistor Q13. The capacitance 21 is alternately charged to the supply voltage and discharged in parallel with the parasitic input capacitance of the current mirror M2.

As set forth hereinbefore, the discharge of the capacitances 20 and 21 at the input of the current mirrors M1 and M2, respectively, substantially speeds up the buildup of the current in the current mirrors. The return to zero of the output currents of these current mirrors can advantageously be accelerated by shunting the parasitic input capacitance of the current mirrors, which is effected in a manner similar to that in the circuit of FIG. 1, by means of two n-channel transistors S1 and S2. The transistor S1 makes it possible to bring the gates of the transistors Q1 and Q2 at the reference voltage V1 and the transistor S2 performs the same function for the gates of the transistors Q3 and Q4. The transistor S1 receives the control signal c2 and the transistor S2 receives the control signal c1.

It is to be noted here, that the capacitances 20 and 21 can readily be integrated because they need only be a fraction of the equivalent input capacitance of the current mirrors M1 and M2.

Figure 4:
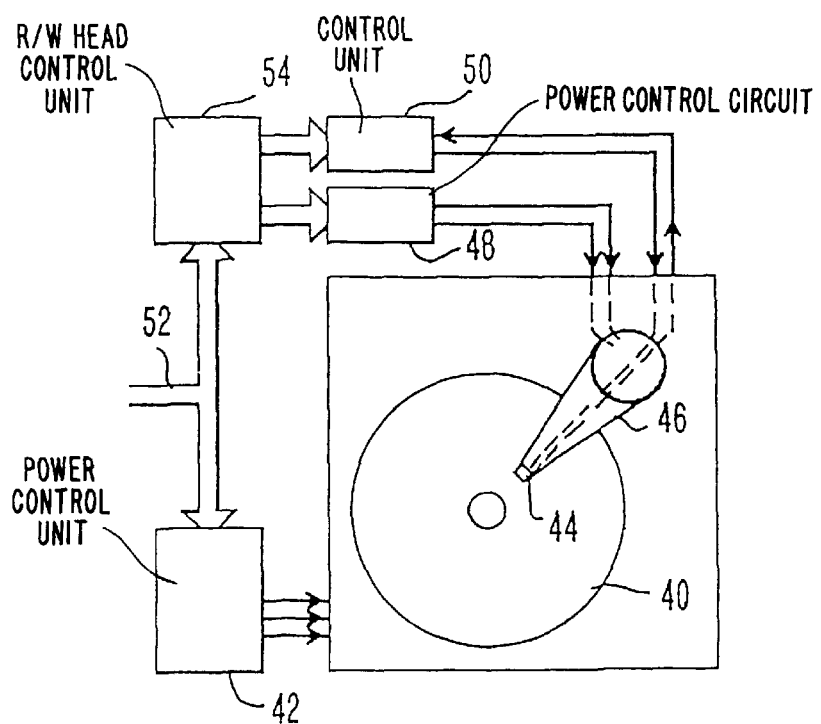
FIG. 4 is a diagrammatic plan view of the use of the invention in an apparatus for the storage of digital information.

FIG. 4 very diagrammatically shows an example of the use of the current switching circuit in accordance with the invention in an apparatus for the storage of digital information on a magnetic disk. The magnetic disc 40 is rotated by a motor, not shown in the Figure, driven by a three-phase current supplied by a power control unit 42. An assembly of read/write heads 44 can be moved over the disk 40 by means of an arm 46 driven by a motor not shown in the Figure, which motor is energized by a power control circuit 48.

A control unit 50 supplies write control signals and receives read signals from the heads 44. The control unit 50 includes a current switching circuit of the type described above.

A set of lines 52 conveys control signals to the control unit 42 for controlling the speed of rotation of the disk 40 and to a unit 54 for controlling the read/write heads. From the control unit 54, control lines lead to control unit 50 and to the power control circuit 48 to control the read/write heads.

In such an apparatus, the use of the current switching circuit in accordance with the invention enables information to be written onto the disk 40 at a high frequency, as is desired in order to improve the performance of the apparatus.

I claim:

1. A circuit for switching a current in a toad, comprising at least two current mirrors each having an input and an output, which current mirrors are arranged to drive the load between two terminals of a power supply alternately in one direction or in the other direction via the output of one or the other of the current mirrors, which are each actuated alternately by means of a control current fed into the respective input, characterized in that each of the current mirrors has, associated with it, a capacitor and a set of switching devices, which are connected and actuated so as to couple the capacitor:

in parallel with the input of its associated current mirror when this current mirror, receiving the control current, delivers current, and in between the power supply terminals when this current mirror does not deliver current.

2. A current switching circuit as claimed in claim 1, characterized in that the current mirrors have an output current to input current ratio greater than unity.

3. A current switching circuit as claimed in claim 1, characterized in that the control current which is injected alternately into one or the other of the current mirrors issues from the same current source, whose current is switched to the one or the other of the inputs of the current mirrors by switching devices.

4. A current switching circuit as claimed in claim 1, characterized in that an additional switching device is connected in parallel with the input of each of the current mirrors, which additional switching device is controlled so as to shunt this input when the current mirror delivers no current.

5. A current switching circuit as claimed in claim 1, characterized in that the switching devices are field effect transistors of the MOS type.

6. A current switching circuit as claimed in claim 1, characterized in that the transistors forming the current mirrors are field effect transistors of the MOS type.

7. An apparatus for the storage of digital information by means of a write head of the inductive type, characterized in that, for driving the write head, it comprises a current switching circuit as claimed in claim 1.

8. A current switching circuit as claimed in claim 2, characterized in that the switching devices are field effect transistors of the MOS type.

9. A current switching circuit as claimed in claim 3, characterized in that the switching devices are field effect transistors of the MOS type.

10. A current switching circuit as claimed in claim 4, characterized in that the switching devices are field effect transistors of the MOS type.

11. A current switching circuit as claimed in claim 2, characterized in that the transistors forming the current mirrors are field effect transistors of the MOS type.

12. A current switching circuit as claimed in claim 3, characterized in that the transistors forming the current mirrors are field effect transistors of the MOS type.

13. A current switching circuit as claimed in claim 4, characterized in that the transistors forming the current mirrors are field effect transistors of the MOS type.

14. An apparatus for the storage of digital information by means of a write head of the inductive type, characterized in that, for driving the write head, it comprises a current switching circuit as claimed in claim 2.

15. An apparatus for the storage of digital information by means of a write head of the inductive type, characterized in that, for driving the write head, it comprises a current switching circuit as claimed in claim 3.

16. An apparatus for the storage of digital information by means of a write head of the inductive type, characterized in that, for driving the write head, it comprises a current switching circuit as claimed in claim 4.

17. An apparatus for the storage of digital information by means of a write head of the inductive type, characterized in that, for driving the write head, it comprises a current switching circuit as claimed in claim 5.

18. An apparatus for the storage of digital information by means of a write head of the inductive type, characterized in that, for driving the write head, it comprises a current switching circuit as claimed in claim 6.

* * * * *